United States Patent
Gorius

(10) Patent No.: US 12,468,115 B2
(45) Date of Patent: Nov. 11, 2025

(54) FILTER ASSEMBLY, IN PARTICULAR FOR A CONTROL LOOP FOR CONTROLLING THE POSITION OF AT LEAST ONE ELEMENT

(71) Applicant: Carl Zeiss SMT GmbH, Oberkochen (DE)

(72) Inventor: Thomas Gorius, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 336 days.

(21) Appl. No.: 18/333,808

(22) Filed: Jun. 13, 2023

(65) Prior Publication Data
US 2023/0324649 A1     Oct. 12, 2023

Related U.S. Application Data

(63) Continuation of application No. PCT/EP2021/084643, filed on Dec. 7, 2021.

(30) Foreign Application Priority Data

Feb. 9, 2021   (DE) .......................... 102021201202.7

(51) Int. Cl.
G02B 7/182     (2021.01)
G03F 7/00      (2006.01)
H03H 1/00      (2006.01)

(52) U.S. Cl.
CPC ......... *G02B 7/182* (2013.01); *G03F 7/70258* (2013.01); *G03F 7/70825* (2013.01); *G03F 7/70883* (2013.01); *G03F 7/709* (2013.01); *H03H 1/00* (2013.01)

(58) Field of Classification Search
CPC .. G03F 7/70825; G03F 7/70883; G03F 7/709; H03H 1/00; H03H 17/04
See application file for complete search history.

(56) References Cited

U.S. PATENT DOCUMENTS

| | | | |
|---|---|---|---|
| 5,960,091 A | 9/1999 | White et al. | |
| 6,438,236 B1 | 8/2002 | Best et al. | |
| 8,392,000 B2 | 3/2013 | Levin et al. | |
| 2003/0195909 A1 | 10/2003 | Chan et al. | |

(Continued)

FOREIGN PATENT DOCUMENTS

| | | |
|---|---|---|
| DE | 35 03 606 A1 | 8/1986 |
| DE | 695 30 865 T2 | 3/2004 |

(Continued)

OTHER PUBLICATIONS

GPTO—Office Action, with translation thereof, for corresponding DE 10 2021 201 202.7 dated Oct. 19, 2021.

(Continued)

*Primary Examiner* — Van N Chow
(74) *Attorney, Agent, or Firm* — Fish & Richardson P.C.

(57) ABSTRACT

A filter assembly, for example for a control loop for controlling the position of at least one element, comprises first and second filters. The first filter suppresses an undesired component in a signal to be filtered. The first filter produces a first signal delay in a first frequency range. The second filter produces a second signal delay in the first frequency range. The second signal delay at least partly compensates the first signal delay.

22 Claims, 9 Drawing Sheets

(56) References Cited

U.S. PATENT DOCUMENTS

| | | | |
|---|---|---|---|
| 2007/0008547 A1* | 1/2007 | Hill | G01B 9/02084 |
| | | | 356/498 |
| 2007/0142968 A1 | 6/2007 | Prisco et al. | |
| 2008/0304077 A1* | 12/2008 | Demarest | G01B 9/02045 |
| | | | 356/486 |
| 2012/0045723 A1 | 2/2012 | Nawata et al. | |
| 2014/0043596 A1* | 2/2014 | Fischer | G03F 7/70825 |
| | | | 355/71 |

FOREIGN PATENT DOCUMENTS

| | | |
|---|---|---|
| DE | 10 2019 218 279 A1 | 1/2020 |
| WO | WO 2017/037341 A1 | 3/2017 |

OTHER PUBLICATIONS

Translation of International Preliminary Report on Patentability for corresponding PCT Appl No. PCT/EP2021/084643, dated Aug. 24, 2023.
Translation of International Search Report for corresponding PCT Appl No. PCT/EP2021/084643, dated Jun. 15, 2022.
Noguchi Yuki et al., "Repetitive control for pneumatic anti-vibration apparatuses under a multi-loop control system", 2015 IEEE International Conference on Industrial Technology (ICIT), IEEE, Mar. 17, 2015 (Mar. 17, 2015), pp. 447-452, XP032785619.

* cited by examiner

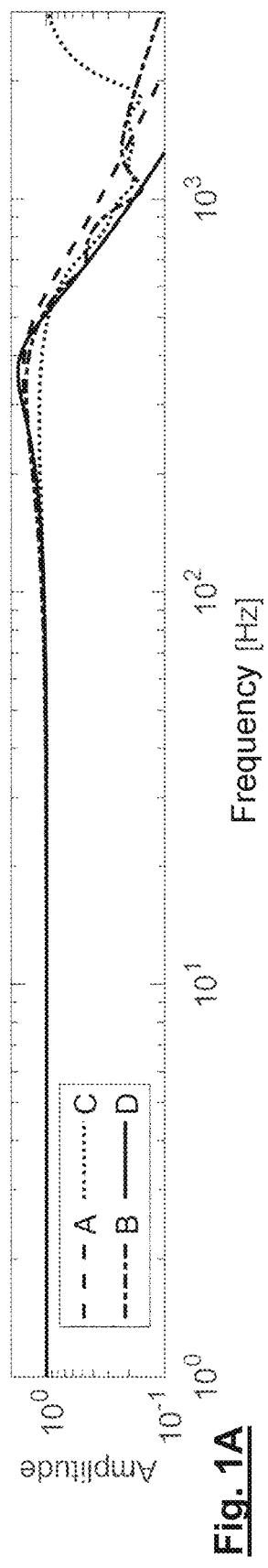
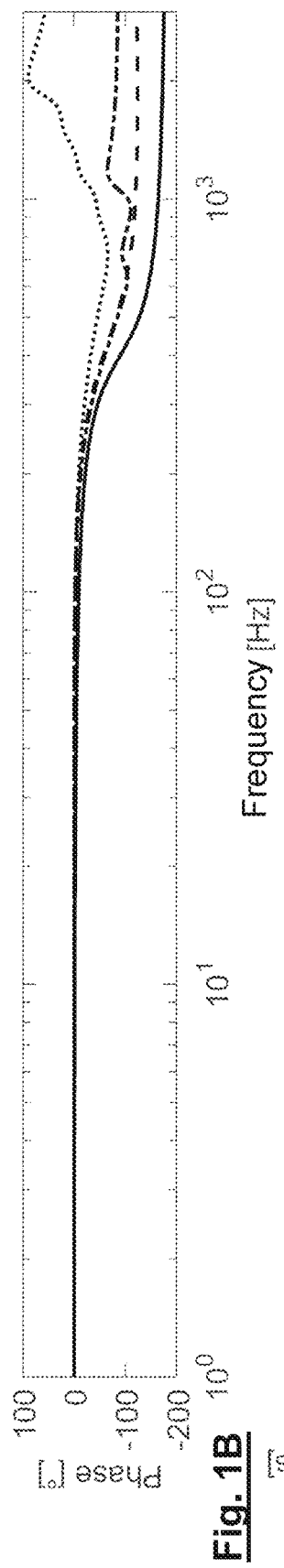
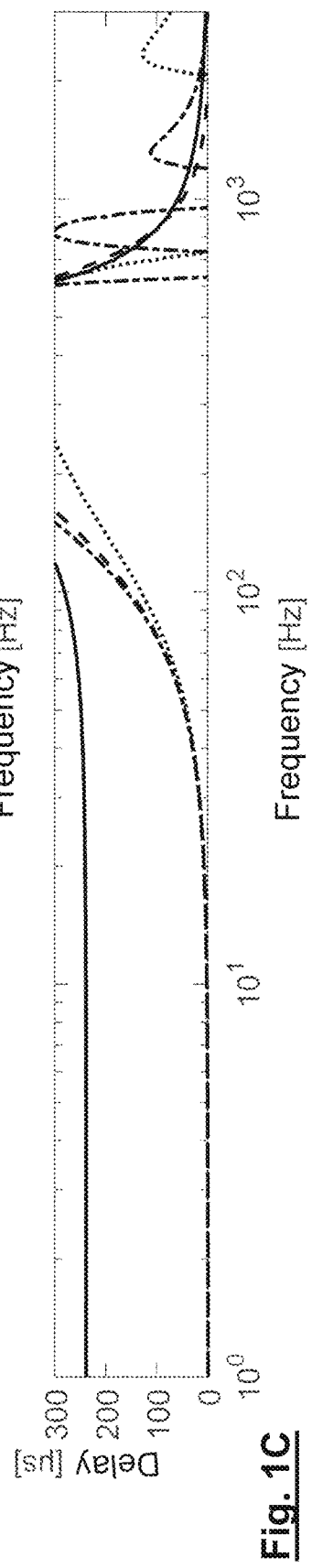
Fig. 1A
Fig. 1B
Fig. 1C

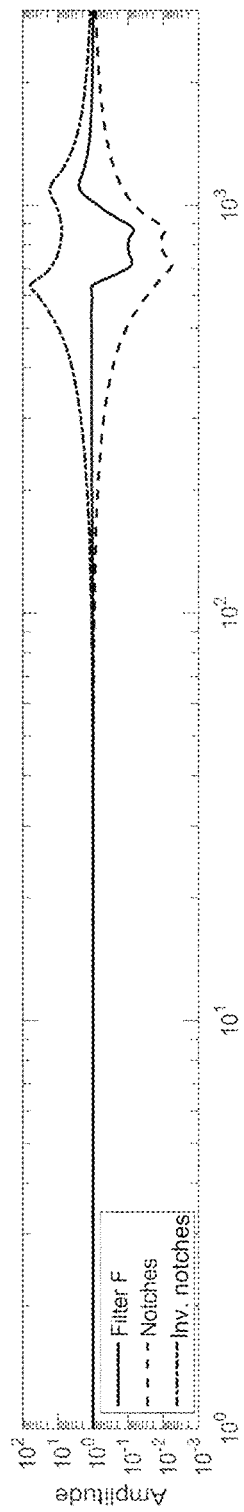
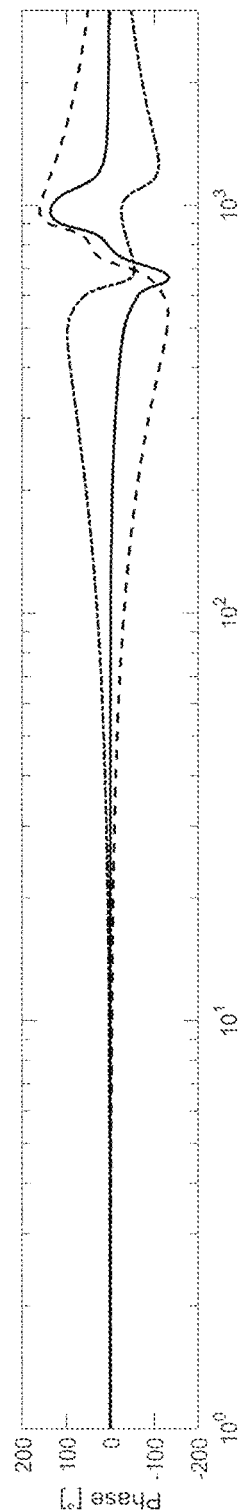
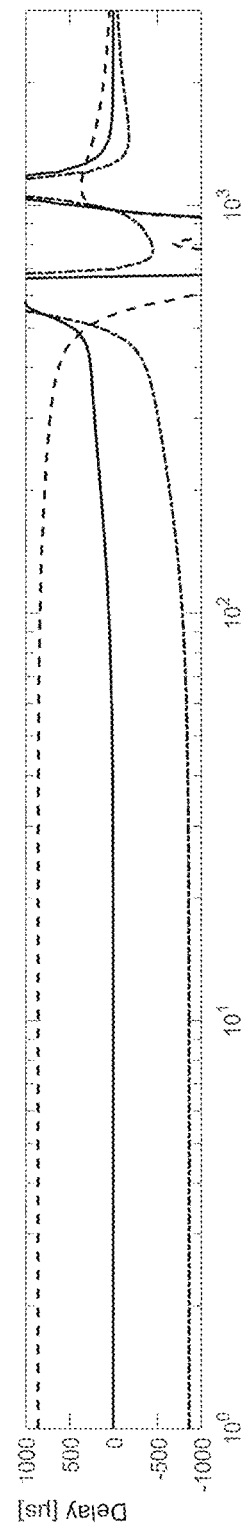
Fig. 6A
Fig. 6B
Fig. 6C

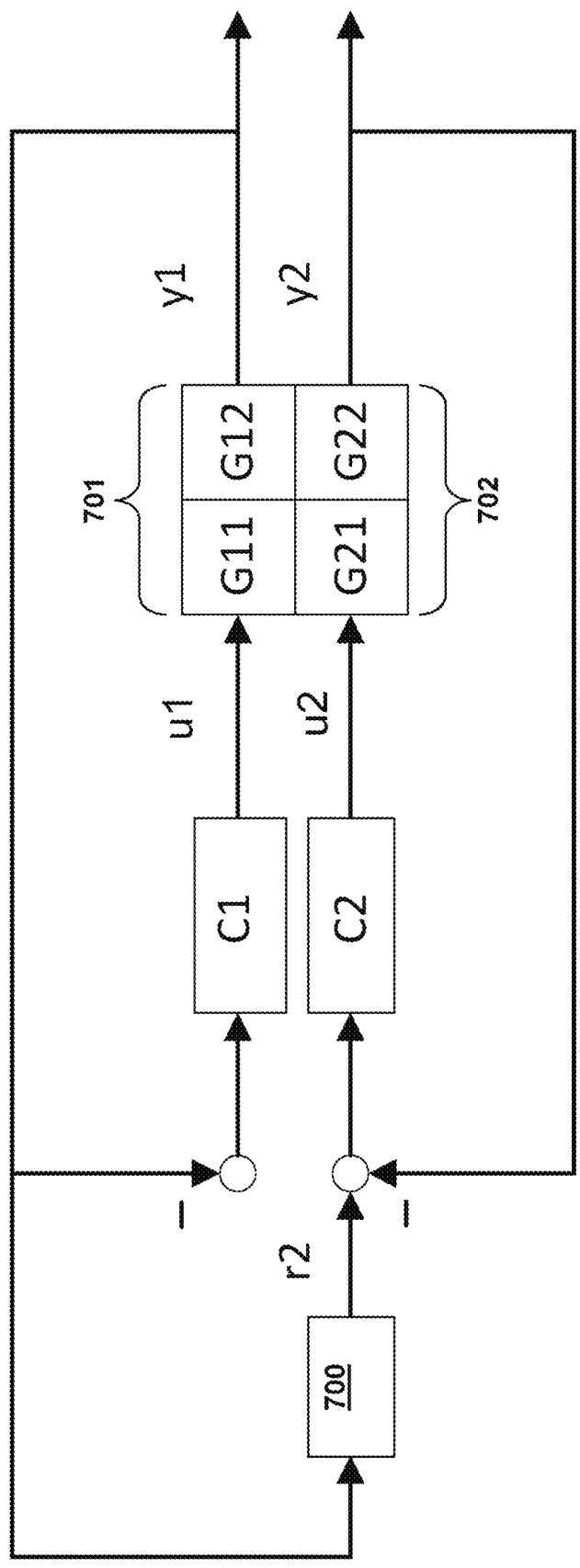

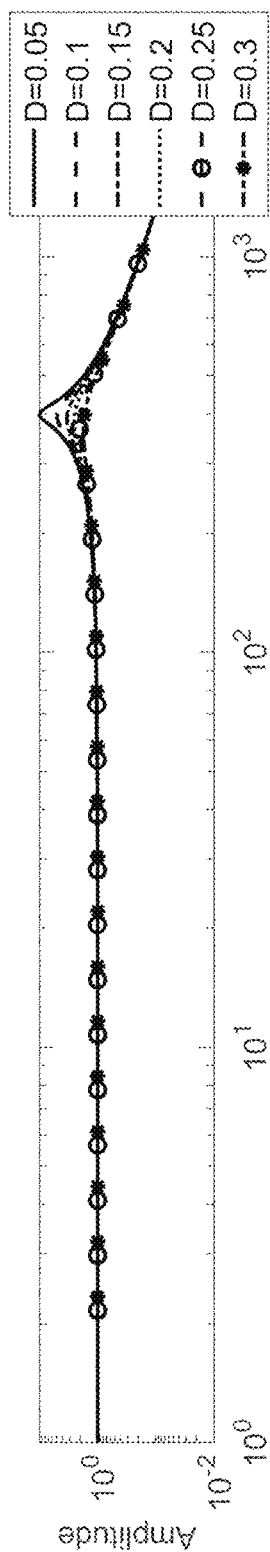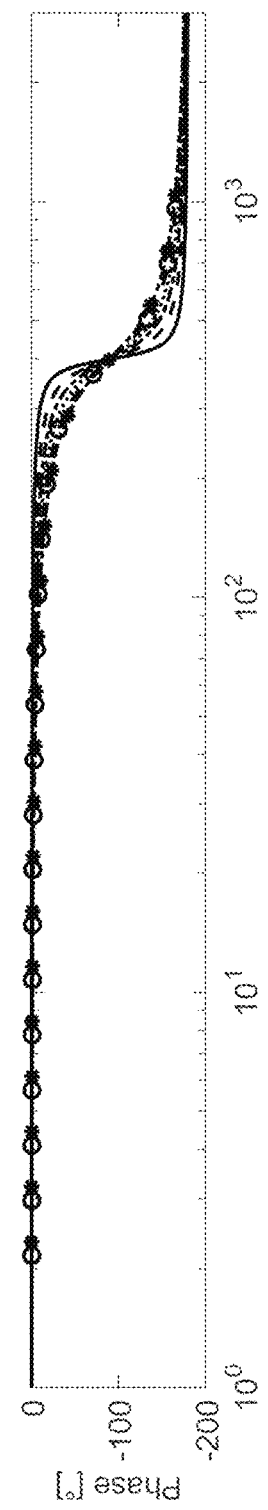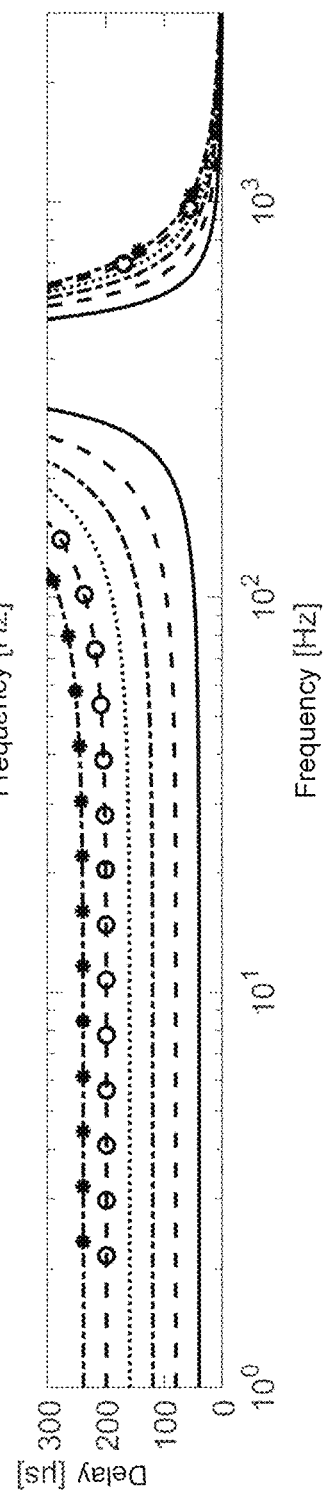

FILTER ASSEMBLY, IN PARTICULAR FOR A CONTROL LOOP FOR CONTROLLING THE POSITION OF AT LEAST ONE ELEMENT

CROSS-REFERENCE TO RELATED APPLICATIONS

The present application is a continuation of, and claims benefit under 35 USC 120 to, international application PCT/EP2021/084643, filed Dec. 7, 2021, which claims benefit under 35 USC 119 of German Application No. 10 2021 201 202.7, filed on Feb. 9, 2021. The entire disclosure of each these applications is incorporated by reference herein.

FIELD

The disclosure relates to a filter arrangement, such as for a control loop for controlling the position of at least one element.

BACKGROUND

Microlithography is used for producing microstructured components, such as for example integrated circuits or LCDs. The microlithography process is carried out in what is known as a projection exposure apparatus, which has an illumination device and a projection lens. The image of a mask (=reticle) illuminated via the illumination device is projected in this case via the projection lens onto a substrate (for example a silicon wafer) that is coated with a light-sensitive layer (photoresist) and arranged in the image plane of the projection lens in order to transfer the mask structure to the light-sensitive coating of the substrate.

In a projection exposure apparatus designed for EUV (i.e. for electromagnetic radiation with a wavelength below 15 nm), mirrors are used as optical components for the imaging process because of the unavailability of light-transmissive materials. These mirrors may for example be mounted on a supporting frame and be designed as being at least partially manipulable in order to allow a movement of the respective mirror for example in six degrees of freedom (i.e. with respect to displacements in the three spatial directions x, y and z and also with respect to rotations $R_x$, $R_y$ and $R_z$ about the corresponding axes).

During the operation of projection exposure apparatuses, especially in EUV systems, dynamic aspects can play an increasingly relevant role for the optical performance of the system. Mechanical disturbances caused by vibrations can adversely affect the positional stability of the optical components. Weakly damped mechanical resonances in the system can lead to an excessive local increase in the interference spectrum in the range of the resonant frequencies and to an associated deterioration in the positional stability of passively mounted components and also of actively controlled components. Furthermore, resonances can lead to instability of the control loop in the case of controlled systems.

A desire that exists in practice, for example in an EUV system, is for example to avoid image errors as a result of relative movements between the mirrors within the projection lens. With an increase in the numerical aperture and the associated increase in the dimensions and masses of individual EUV mirrors, this can prove to be a demanding challenge, since vibrations from the wafer holder or wafer displacement drive and/or from the reticle holder or reticle displacement drive acting on the respective EUV minors possibly can generally no longer be sufficiently suppressed by corresponding actuation.

One possible approach to address this issue includes, for example, the implementation of a follow-up control, in which undesired movements, e.g., movements which are caused by vibrations, of a minor serving as a reference are tracked by the remaining mirrors. The mirror used as a reference in such a follow-up control can be a mirror (e.g. the last mirror in the projection lens in relation to the optical beam path) which itself is difficult to control, e.g. due to dynamic properties.

Although this concept basically enables low-frequency movements or rigid-body shifts of the mirror serving as a reference for the follow-up control to be taken into account, in practice there is the further desire to suppress high-frequency components in the movement of the minor serving as a reference in the follow-up control by appropriate filtering. In the case of such filtering, as will be explained in more detail with reference to FIGS. 8A-8C, a further issue can arise that the limitation of the amplitude increase in the filter transfer function is accompanied by a delay in the output signal introduced by the filter relative to the input signal of the filter. This delay can cause low-frequency subsequent errors, which correspondingly translate into image errors.

FIGS. 8A-8C show for an exemplary filter transfer function F(s)

$$F(s) = \frac{(2\pi \cdot 400)^2}{s^2 + 2 \cdot D \cdot 2\pi \cdot 400s + (2\pi \cdot 400)^2} \quad (1)$$

and for different values of the damping parameter D (from D=0.05 to D=0.3) the respective frequency curves of amplitude (FIG. 8A), phase (FIG. 8B) and delay (FIG. 8C). The filter transfer function F(s) corresponds to a second-order low-pass filter with a corner frequency of 400 Hz.

The delay plotted in FIG. 8C is equivalent to the group delay and corresponds to the negative derivative of the function which is plotted in FIG. 8B and describes the frequency dependence of the phase at the respective frequency value.

As shown in a comparison of the curves plotted in FIGS. 8A-8C, the desired limitation of the amplitude increase via the damping parameter according to FIG. 8A and the limitation of the delay according to FIG. 8C represent mutually opposing (i.e. contradictory) factors. This can be made more difficult by the fact that in the application of the control of the position of at least one element in a microlithographic projection exposure apparatus, which is for example envisaged according to the disclosure, the signal to be filtered (as the position signal of the mirror serving as a reference in the follow-up control) is not known in advance, and so elimination of the undesired delay or the abovementioned frequency dependence of the phase via what is known as "forward-backward filtering" is ruled out.

Reference is made merely by way of example to U.S. Pat. No. 5,960,091.

SUMMARY

The present disclosure seeks to provide a filter arrangement, such as for a control loop for controlling the position of at least one element, which can allow reliable position control while at least partially avoiding the problems described above.

A filter arrangement according to the disclosure, for example for a control loop for controlling the position of at least one element, has
- a first filter for suppressing an unwanted component in a signal to be filtered, with this first filter causing a first signal delay in a first frequency range; and
- at least one second filter, with this second filter causing a second signal delay in the first frequency range, which at least partially compensates for the first signal delay.

According to one embodiment, the first signal delay is a positive signal delay generated by the first filter in the settled state and the second signal delay is a negative signal delay generated by the second filter in the settled state.

For the purposes of the present application, "signal delay in the settled state" of a filter is understood to mean the group delay in the frequency range from zero to $2\pi f_e$, where the frequency $f_e$ represents an assessment criterion that is suitably selectable depending on the specific application. The group delay or signal delay already results, according to the disclosure, directly as a property of a specific filter (and is not added afterward in a separate stage), wherein the group delay or signal delay for example can also assume negative values, which is precisely being used for the compensation principle according to the disclosure (by using filters which have group delay or signal delay values that are suitable directly for mutual compensation, in combination with one another).

Furthermore, a control loop according to the disclosure for controlling the position of at least one element, for example in a microlithographic projection exposure apparatus, has:
- a controller for controlling a force exerted on the element by at least one actuator, based on a reference signal, and
- a filter arrangement for filtering the reference signal;
- wherein this filter arrangement is designed according to the features described above.

The disclosure involves the concept of combining a plurality of filters that are matched to one another in a suitable manner (for example with regard to different corner frequencies) to achieve a compensation effect such that the delays introduced by individual filters at least partially cancel each other out in a relevant (typically low-frequency) frequency range. As a result, a profile can be achieved overall with regard to the frequency dependence of amplitude, phase or delay in which—as described in more detail below with reference to different exemplary embodiments— e.g. while accepting an amplitude increase in (typically higher frequency) areas that are less relevant for the stability of the control loop, a low-delay suppression of undesired components is achieved via the aforementioned compensation effect. In addition, the concrete desired properties of the respective optical system can be specifically taken into account by way of a suitable parameterization of the individual filters combined according to the disclosure and the design freedom provided by this parameterization capability.

In other words, according to the disclosure, unwanted components can be suppressed in a control loop while limiting the delay introduced by the filtering that is used for this purpose, without at the same time increasing the amplification in the relevant frequency range.

The concept according to the disclosure can be used for example in a follow-up control in which, for example, an optical element that is itself difficult to control (such as a last mirror in the projection lens in relation to the optical beam path) is used as a reference for adjusting the position of further optical elements (e.g. the remaining minors of the projection lens). In this case, higher-frequency components in the measurement signal of the optical element serving as a reference in the follow-up control can be suppressed by the low-delay filtering according to the disclosure.

Since the compensation principle described above is implemented according to the disclosure in the filter design itself, the delay can be reduced without the signal to be filtered itself (i.e. in the above example the position signal of the optical element or mirror serving as a reference) having to be known in advance.

According to one embodiment, the first filter has a low-pass filter.

According to one embodiment, the second filter has an inverse low-pass filter.

According to one embodiment, this inverse low-pass filter compensates for the signal delay of the first filter at a frequency of 1 Hz by at least 60%, such as at least 70%.

This inverse low-pass filter has a negative signal delay and can, for example, compensate for the signal delay of the first filter by at least 60% for frequencies of less than or equal to $f_e$, i.e.

$$|\Delta T_1(\omega)+\Delta T_2(\omega)| \le 0.4 \Delta T_1(\omega), f \text{ or } \omega \in (0, 2\pi f_e]$$

wherein $\Delta T_1(\omega)$ represents the group delay of the first filter and $\Delta T_2(\omega)$ represents the group delay of the second filter. The frequency $f_e$ can be specified here as one hundredth of the smallest corner frequency (=absolute value of the associated eigenvalue divided by $2\pi$) of the first filter. The second filter does not have to be causal on its own, since a realizable overall filter results from connecting the first and the second filter in series.

According to one embodiment, the first filter has at least one notch filter (=local suppression filter) for the local suppression of an unwanted component in the signal to be filtered. The minimum amplitude of this notch filter can be less than 0.75.

According to one embodiment, the second filter has at least one inverse notch filter.

According to one embodiment, this inverse notch filter compensates for the signal delay of the first filter at a frequency of 1 Hz by at least 25%, such as at least 50%.

For example, the combination of all inverse notch filters can compensate for the signal delay of the first filter in terms of absolute value by at least 25% for frequencies that are less than or equal to $f_e$, i.e.

$$|\Delta T_1(\omega)+\Delta T_{iNotch}(\omega)| \le 0.75 \Delta T_1(\omega), f \text{ or } \omega \in (0, 2\pi f_e]$$

wherein $\Delta T_{iNotch}(\omega)$ represents the total group delay (sum) of all inverse notch filters.

According to one embodiment, the element is an optical element of an optical system.

According to one embodiment, the element is an optical element of a microlithographic projection exposure apparatus, for example a projection exposure apparatus designed for operation in the EUV.

According to one embodiment, the reference signal is a position signal which is characteristic of the position of a further element in the projection exposure apparatus.

According to one embodiment, this further element is the last optical element of the projection exposure apparatus in relation to the optical beam path.

According to another embodiment, this further element is a supporting structure of the projection exposure apparatus.

According to one embodiment, the controller is designed to control the force exerted by a plurality of actuators on a respective element, based on the reference signal.

According to one embodiment, the element is a minor.

The disclosure also further relates to a microlithographic projection exposure apparatus with a control loop having the features described above.

Further configurations of the disclosure are evident from the description and the dependent claims.

BRIEF DESCRIPTION OF THE DRAWINGS

The disclosure is explained in greater detail below on the basis of exemplary embodiments illustrated in the accompanying figures, in which:

FIGS. 1A-1C show diagrams to explain the effect achieved in possible exemplary embodiments of a filter arrangement according to the disclosure compared with a conventional filter arrangement;

FIGS. 6A-6C show diagrams to explain a further possible exemplary embodiment of the disclosure;

FIG. 7 shows a schematic illustration of a coupled control loop to explain a possible application of the disclosure;

FIGS. 8A-8C show diagrams for explaining a problem occurring in a conventional control loop.

DETAILED DESCRIPTION

Figure 2A:
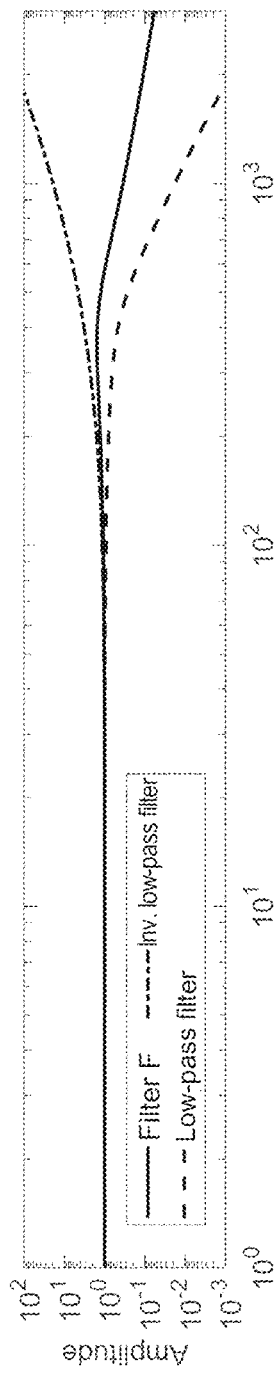
FIGS. 2A-2C show diagrams to explain a decomposition for the exemplary embodiment "A" from FIGS. 1A-1C.

FIG. 7 shows a schematic illustration of a coupled control loop to explain a possible application of the disclosure.

According to FIG. 7, two measurement signals y1 and y2 are assigned to controllers C1 and C2, respectively. The measurement signal y1 can be, for example, the last mirror, in relation to the optical beam path, of a projection lens (e.g. with the construction described with reference to FIG. 9). The measurement signal y2 can then represent the remaining mirrors of the projection lens, which are intended to follow the reference signal y1 in a follow-up control. As a result, the combination of mirrors represented by y1 and y2 should effectively behave like a single rigid minor in order to avoid an image shift and associated image errors in the optical imaging process. The actuating signal u1 affects both the measurement signal y1 via the system G11 and the measurement signal y2 via the system G21. The same applies to the actuating signal u2 and the systems G22 and G12. There is mechanical coupling of the elements represented by y1 and y2.

The existing mechanical coupling as a result of the reaction forces via the support frame very often involves the integration of a filter (designated with "700" in FIG. 7) in the feedback chain formed according to FIG. 7. With regard to the design of this filter 700, however, there is the problem, already discussed with reference to FIGS. 8A-8C, of mutually opposing or contradictory properties with regard firstly to the suppression of the excessive amplitude increase and secondly to the reduction of any delay introduced by the filter 700. The result of the introduction of a significant delay via the filter 700 would be, for example, that the group of minors to be tracked within the follow-up control no longer effectively behaves like a single rigid minor, which ultimately leads to image errors in the optical imaging process.

The diagrams of FIGS. 8A-8C proceed initially from a filter 700 with the following filter transfer function F(s) as an example:

$$F(s) = \frac{(2\pi \cdot 400)^2}{s^2 + 2 \cdot D \cdot 2\pi \cdot 400s + (2\pi \cdot 400)^2} \quad (1)$$

In FIGS. 8A-8C, for this filter transfer function F(s), the respective frequency curves of amplitude (FIG. 8A), phase (FIG. 8B) and delay (FIG. 8C) are plotted for different values of the damping parameter D (from D=0.05 to D=0.3).

A comparison of the results obtained for the different values of the damping parameter D according to FIGS. 8A-8C shows that an increase in damping to limit the amplitude magnification in the filter transfer function F(s) according to FIG. 8A is accompanied by an increase in the delay introduced by the filter 300 of the output signal of this filter 300 relative to the input signal according to FIG. 8C. This delay is equivalent to the group delay and corresponds to the negative derivative of the function which is plotted in FIG. 8B and describes the frequency dependence of the phase at the respective frequency value.

According to the disclosure, a filter transfer function is now implemented which makes it possible to reduce the delay introduced by the filter 700 within a frequency range and at the same time limit the amplitude to values that are still acceptable.

For this purpose, a plurality of filters are used in combination according to the disclosure, each of which is designed or matched to one another in such a way that at least partial mutual compensation is achieved with regard to the total delay introduced in the relevant frequency range.

In a general approach, the filter types low-pass filter, inverse low-pass filter, notch filter and inverse notch filter can be combined with each other in such a way that overall—depending on the specific desired properties in the entire optical system—a suitable compromise between the suppression attained in the range of high frequencies or the accepted amplitude increase, on the one hand, and, on the other hand, the ultimately attained reduction in delay is achieved. Here, as described below, it is also possible to combine basic filter functions (2) to (5) to form a chain of low-pass filters, inverse low-pass filters, notch filters and inverse notch filters. Each of the filter types can appear as often as desired.

A low-pass filter is described by the basic filter function:

$$F_{LP}(s, \omega, D) = \frac{\omega^2}{s^2 + 2D\omega s + \omega^2} \quad (2)$$

A notch filter is described by the basic filter function:

$$F_{notch}(s, \omega, D, a) = \frac{s^2 + 2\frac{D}{a}\omega s + \omega^2}{s^2 + 2Da\omega s + \omega^2} \quad (3)$$

When choosing $\alpha \geq 1.16 > 1/\sqrt{0.75}$, the minimum amplitude is less than 0.75.

An inverse low-pass filter is described by the basic filter function:

$$F_{iLP}(s, \omega, D) = 1/F_{LP}(s, \omega, D) \quad (4)$$

An inverse notch filter is described by the basic filter function:

$$F_{inotch}(s, \omega, D, \alpha) = 1/F_{notch}(s, \omega, D, \alpha) \quad (5)$$

The chain formed by combining these basic filter functions (2)-(5) can be described by:

$$F = \prod_{i=1}^{N_i} F_{LP}(s, \omega_i, D_i) \cdot \prod_{j=1}^{N_j} F_{iLP}(s, \omega_j, D_j) \cdot \prod_{k=1}^{N_k} F_{notch}(s, \omega_k, D_k, \alpha_k) \cdot \prod_{l=1}^{N_l} F_{inotch}(s, \omega_l, D_l, \alpha_l) \quad (6)$$

where the behavior of this chain can then be influenced by the parameters indexed with i, j, k, l in equation (6). The parameters $N_i$, $N_j$, $N_k$ and $N_l$ are all greater than or equal to zero.

For three specific exemplary embodiments "A", "B" and "C" of such a chain or the corresponding filter transfer function F(s), the respective frequency curves of amplitude (FIG. 1A), phase (FIG. 1B) and delay (FIG. 1C) are plotted in FIGS. 1A-1C. For comparison, the corresponding frequency curves for the conventional configuration from FIGS. 8A-8C are entered with the value of the damping parameter D=0.3 (and represented each by solid lines in FIGS. 1A-1C), see curve "D". The effectiveness of the compensation is demonstrated in each case by FIGS. 2A-2C (=decomposition of "A"), FIGS. 3A-3C (=decomposition of "B") and FIGS. 4A-4C (=decomposition of "C"). For the assessment of the compensation, the frequency range (0.20 Hz) is used uniformly, which is greater than that according to the individual determination of the frequency $f_e$.

Figure 2B:
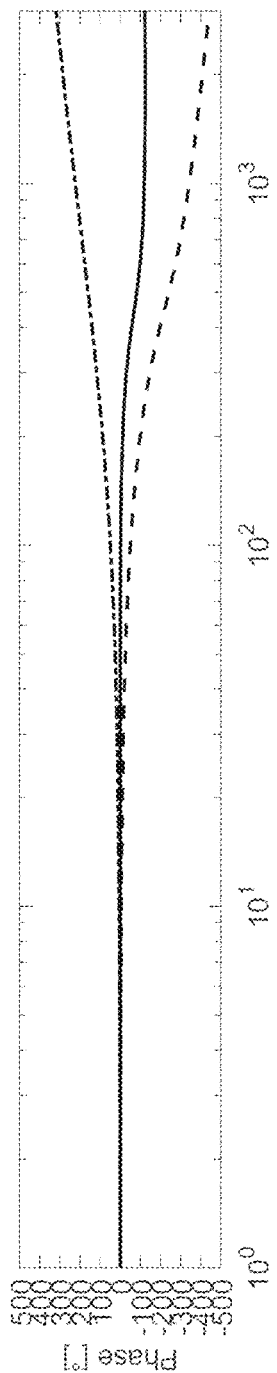
Figure 2C:
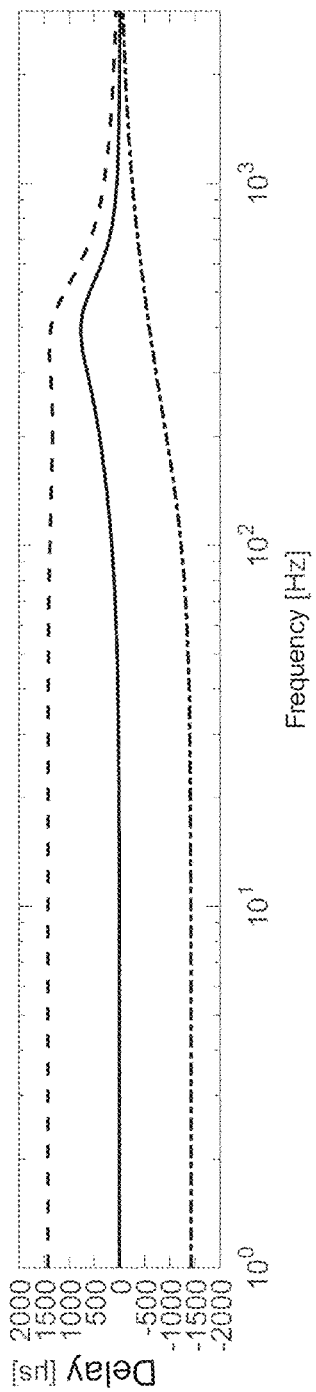

The first example "A" (illustrated by dashed lines in FIGS. 1A-1C) has a very small delay in the frequency range up to 20 Hz according to FIG. 1C. According to FIG. 1A, the amplitude magnification is comparable to that of "D". However, the suppression above 500 Hz is comparatively lower. The filter of "A" consists of three low-pass filters and three inverse low-pass filters. As shown in FIGS. 2A-2C (=decomposition of "A"), the delays of all inverse low-pass filters compensate the delay of all low-pass filters by almost 100%.

Figure 3A:
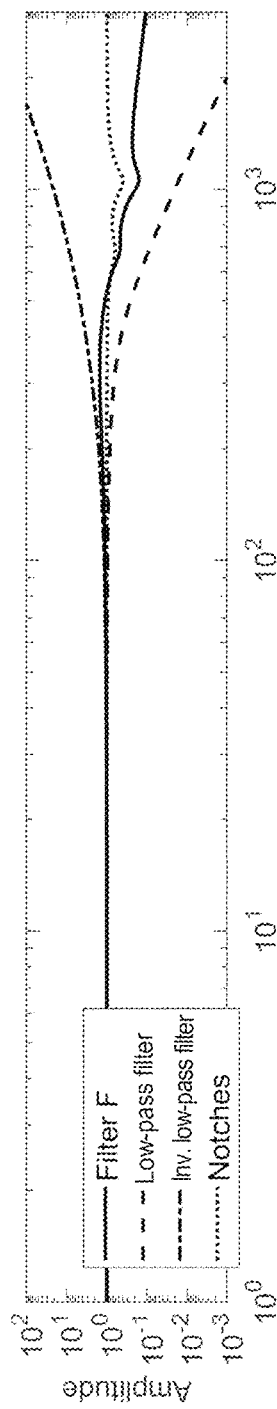
FIGS. 3A-3C show diagrams to explain a decomposition for the exemplary embodiment "B" from FIGS. 1A-1C.
Figure 3B:
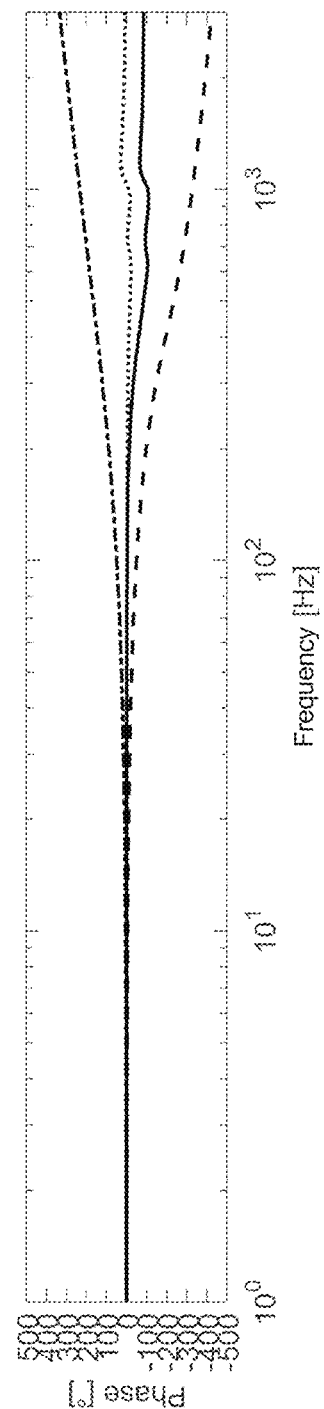
Figure 3C:
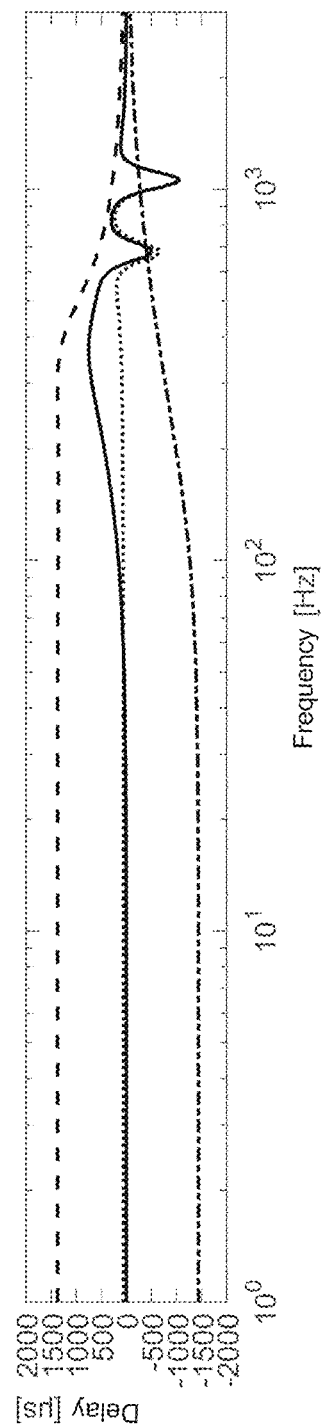

Example "B" is basically based on "A," but improves the suppression locally at 650 Hz and 1050 Hz by using two notch filters. Conversely, the suppression above 1300 Hz drops less than in "A". FIGS. 3A-3C (=decomposition of "B") clearly show that the delay of all low-pass filters (1375 µs) and the delay of all notch filters (61 µs) are almost completely (100%) compensated for by the delay of all the inverse low-pass filters (−1436 µs).

Figure 4A:
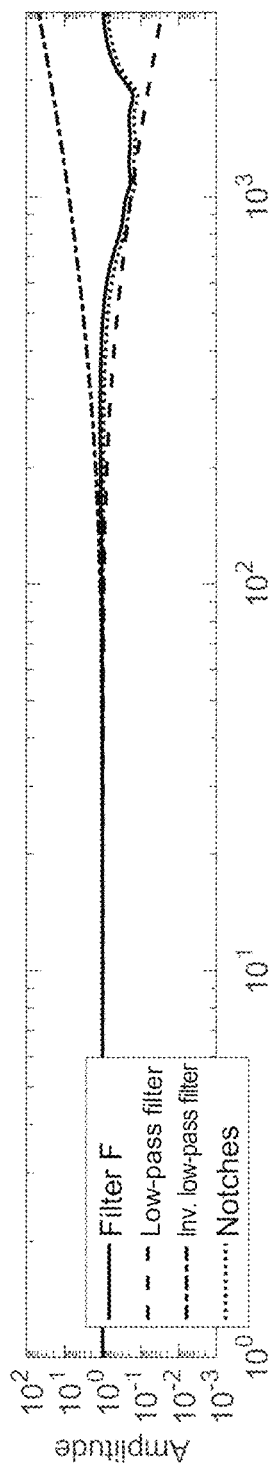
FIGS. 4A-4C show diagrams to explain a decomposition for the exemplary embodiment "C" from FIGS. 1A-1C.
Figure 4B:
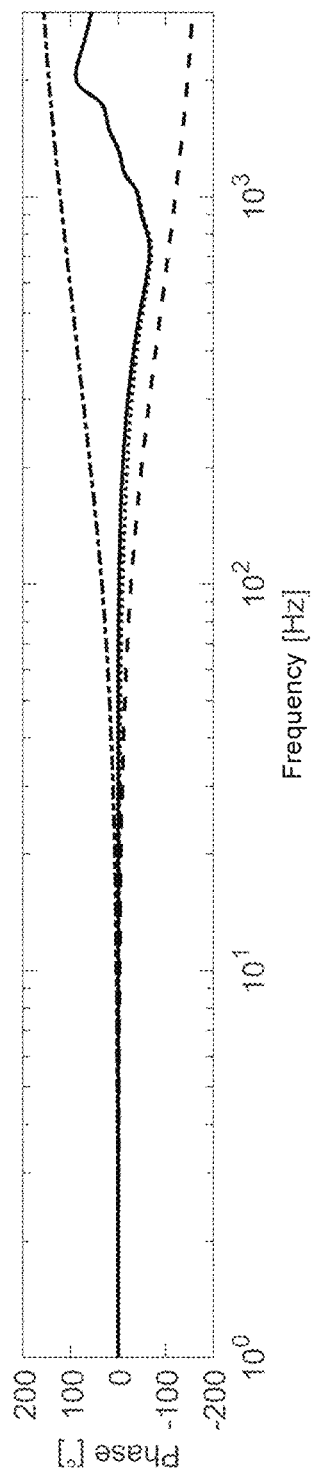
Figure 4C:
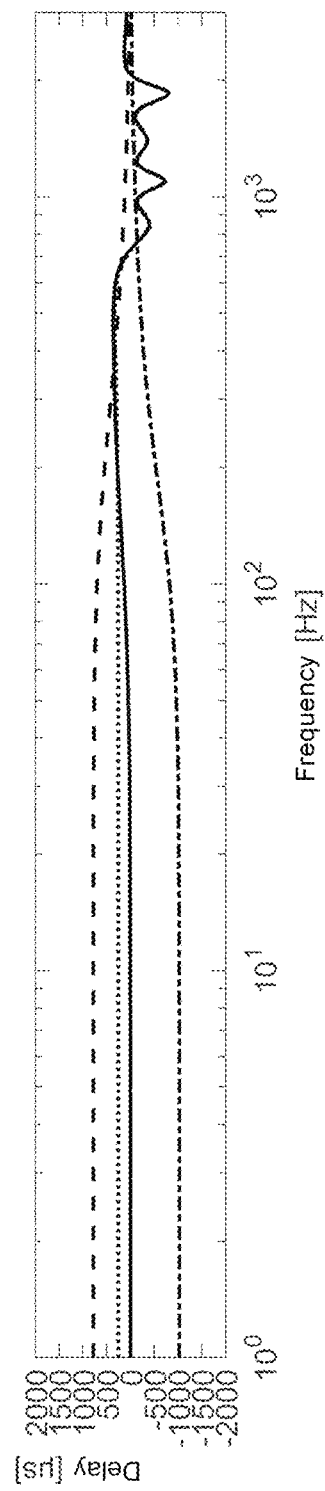

The example "C" is characterized by a very low amplitude magnification and very good suppression up to 1000 Hz. In order to achieve this, there is no effective suppression above 2000 Hz. The filter shown consists of a low-pass filter, an inverse low-pass filter and four notch filters. FIGS. 4A-4C (=decomposition of "C") show that the delay of the low-pass filter (780 µs) and that of all the notch filters (253 µs) are almost 100% compensated for by the delay of the inverse low-pass filter (−1033 µs).

A further embodiment is shown in FIGS. 6A-6C. Here, three notch filters are combined with three inverse notch filters. The overall filter has very good suppression in the range between 700 Hz and 900 Hz. The amplitude magnification now occurs at higher frequencies, here at around 1100 Hz. The compensation of the delay of all the notch filters (858 µs) and of all the inverse notch filters (−856 µs) is more than 99%.

All parameterizations of the examples given are provided below.

Figure 5A:
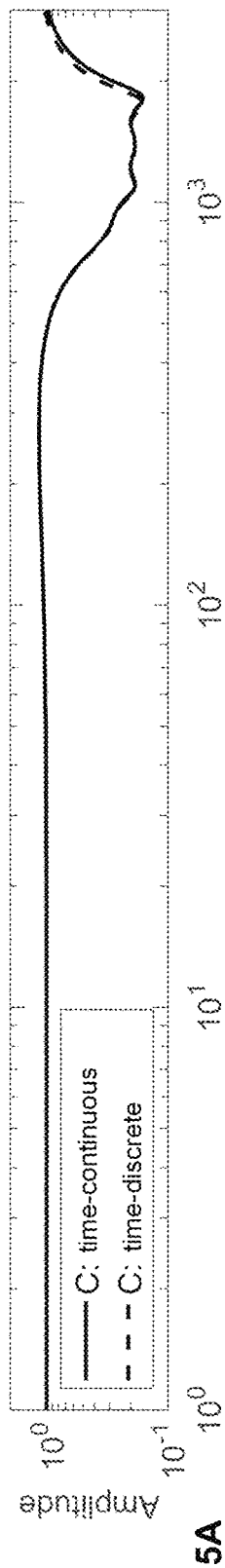
FIGS. 5A-5C show diagrams to explain the discretization of an exemplary embodiment for later implementation.
Figure 5B:
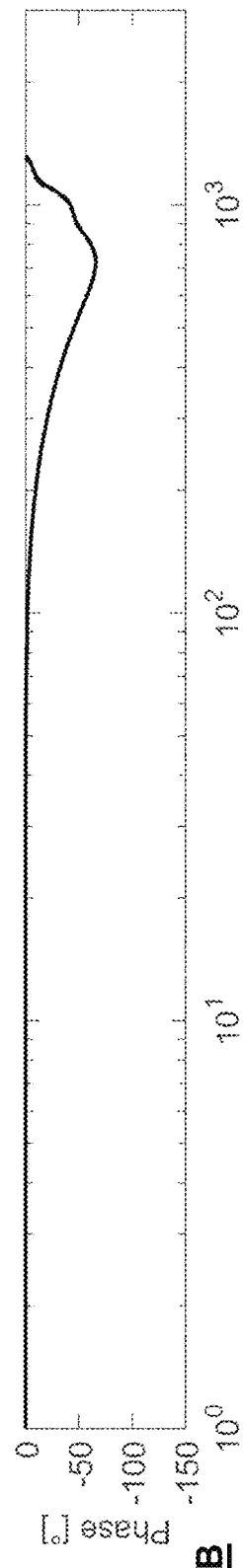
Figure 5C:
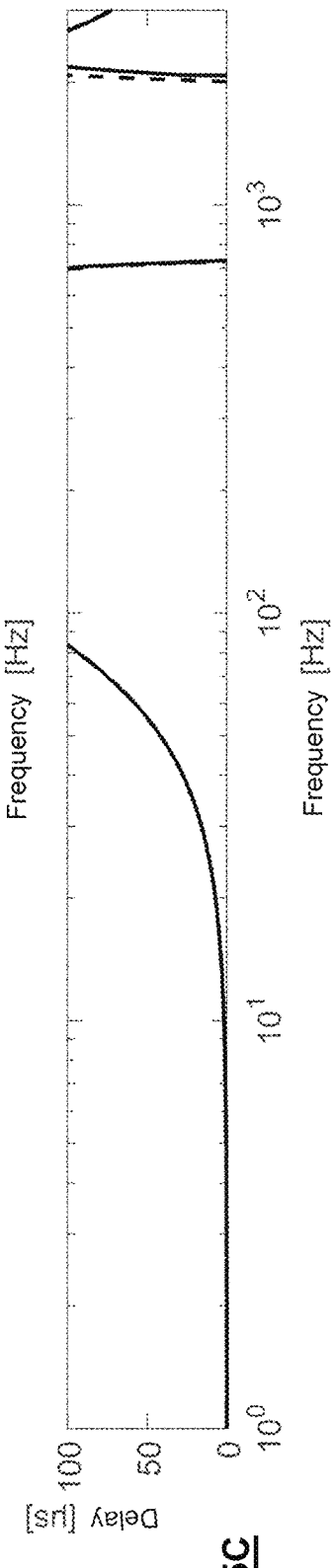

Example "A": Three low-pass filters, three inverse low-pass filters $\omega_i = \{442.5, 1013, 795.2\} \cdot 2\pi$ $D_i = \{0.46, 1.85, 1.28\}$ $\omega_j = \{2483.2, 662.8, 3478.2\} \cdot 2\pi$ $D_j = \{2.42, 1.9, 2.22\}$ Example "B": Three low-pass filters, three inverse low-pass filters, two notch filters $\omega_i = \{418.2, 1223, 943.8\} \cdot 2\pi$ $D_i = \{0.53, 1.9, 1.41\}$ $\omega_j = \{2055, 621.6, 2957.8\} \cdot 2\pi$ $D_j = \{2.23, 1.71, 2.01\}$ $\omega_k = \{675, 1052.4\} \cdot 2\pi$ $\alpha_k = \{1.23, 1.57\}$ $D_k = \{0.13, 0.13\}$ Example "C": A low-pass filter, an inverse low-pass filter, four notch filters $\omega_i = 510.6 \cdot 2\pi$ $D_i = 1.25$ $\omega_j = 444.9 \cdot 2\pi$ $D_j = 1.44$ $\omega_k = \{1839.2, 851, 1091.12, 1393.3\} \cdot 2\pi$ $\alpha_k = \{1.94, 1.64, 1.37, 1.92\}$ $D_k = \{0.14, 0.28, 0.12, 0.27\}$ Example from FIGS. 6A-6C: Three notch filters, three inverse notch filters $\omega_k = \{877.9, 638.9, 712.8\} \cdot 2\pi$ $\alpha_k = \{3.5, 2.87, 3.5\}$ $D_k = \{0.12, 0.4, 0.15\}$ $\omega_l = \{578.94, 636, 1097.9\} \cdot 2\pi$ $\alpha_l = \{3.33, 2.33, 2.75\}$ $D_l = \{0.4, 0.08, 0.17\}$ For later implementation, the above time-continuous filters are discretized. This is possible, for example, by Tustin transformation without losing certain desired properties of the filter, see FIGS. 5A-5C for discretization of example "C".

Figure 9:
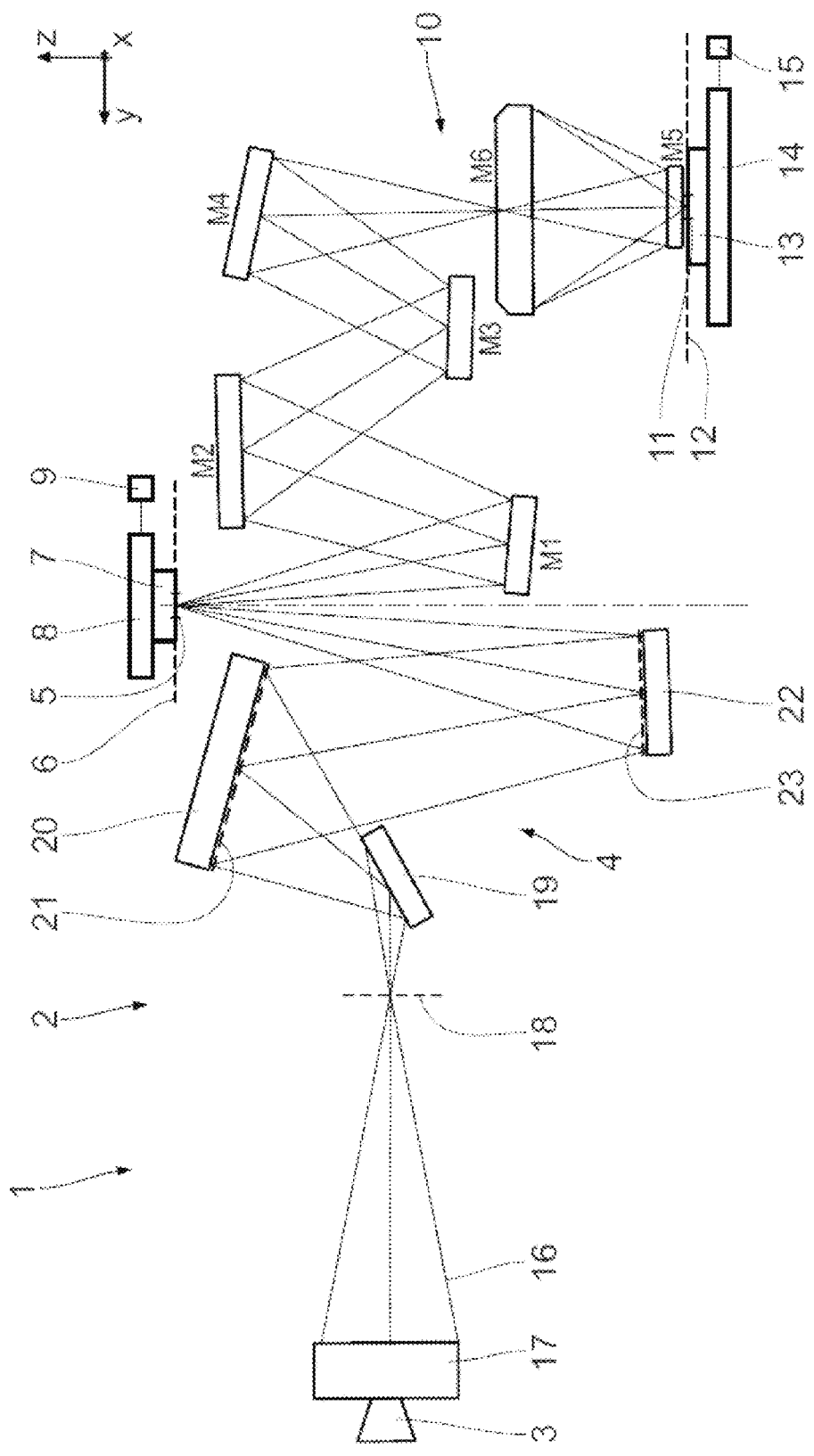
FIG. 9 shows a schematic illustration of a projection exposure apparatus for EUV projection lithography in a meridional section.

FIG. 9 schematically shows a projection exposure apparatus 1 for EUV projection lithography in a meridional section.

According to FIG. 9, the projection exposure apparatus 1 comprises an illumination device 2 and a projection lens 10. The illumination device 2 serves to illuminate an object field 5 in an object plane 6 with radiation from a radiation source 3 by way of an illumination optical unit 4. What is exposed here is a reticle 7 disposed in the object field 5. The reticle 7 is held by a reticle holder 8. The reticle holder 8 is displaceable, for example in a scanning direction, by way of a reticle displacement drive 9.

For purposes of explanation, a Cartesian xyz-coordinate system is shown in FIG. 9. The x-direction runs perpendicularly to the plane of the drawing. The y-direction runs horizontally, and the z-direction runs vertically. The scanning direction runs in the y-direction in FIG. 1. The z-direction runs perpendicular to the object plane 6.

The projection lens 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable, for example in the y-direction, by way of a wafer displacement drive 15. The displacement on the one hand of the reticle 7 by way of the reticle displacement drive 9 and on the other hand of the wafer 13 by way of the wafer displacement drive 15 may take place in such a way as to be synchronized with one another.

The radiation source 3 is an EUV radiation source. The radiation source 3 can emit EUV radiation, which is also referred to below as used radiation or illumination radiation. For example, the used radiation has a wavelength in the range between 5 nm and 30 nm. The radiation source 3 may be a plasma source, for example an LPP ("laser produced plasma") source or a GDPP ("gas discharged produced plasma") source. It may also be a synchrotron-based radiation source. The radiation source 3 can also be a free-electron laser ("free-electron laser", FEL). The illumination radiation 16 emerging from the radiation source 3 is focused by a collector 17. The illumination radiation 16 propagates through an intermediate focus in an intermediate focal plane 18 downstream of the collector 17. The intermediate focal plane 18 can represent a separation between a radiation source module, having the radiation source 3 and the collector 17, and the illumination optical unit 4.

The illumination optical unit 4 comprises a deflection minor 19 and, arranged downstream thereof in the beam path, a first facet mirror 20. If the first facet mirror 20 is arranged in a plane of the illumination optical unit 4 which is optically conjugate to the object plane 6 as a field plane, this facet mirror is also referred to as a field facet minor. The first facet mirror 20 comprises a multiplicity of individual first facets 21, some of which are shown in FIG. 1 only by way of example. In the beam path of the illumination optical unit 4, a second facet minor 22 is arranged downstream of the first facet mirror 20. If the second facet minor 22 is arranged in a pupil plane of the illumination optical unit 4, it is also referred to as a pupil facet minor. The second facet minor 22 comprises a plurality of second facets 23, some of which are also shown in FIG. 1 only by way of example.

The projection lens 10 comprises a plurality of mirrors Mi, which are consecutively numbered in accordance with their arrangement in the beam path of the projection exposure apparatus 1. In the example shown in FIG. 9, the projection lens 10 includes six minors M1 to M6. Alternatives with four, eight, ten, twelve or any other number of mirrors Mi are likewise possible. The penultimate mirror M5 and the last minor M6 each have a passage opening for the illumination radiation 16. The projection lens 10 is a doubly obscured optical unit. The projection lens 10 has an image-side numerical aperture that is greater than 0.5 and may also be greater than 0.6, and may be for example 0.7 or 0.75.

Reflection surfaces of the mirrors Mi can be embodied as freeform surfaces without an axis of rotational symmetry. Alternatively, the reflection surfaces of the mirrors Mi can be designed as aspherical surfaces with exactly one axis of rotational symmetry of the reflection surface shape. Just like the minors of the illumination optical unit 4, the mirrors Mi can have highly reflective coatings for the illumination radiation 16. These coatings can be designed as multilayer coatings, such as with alternating layers of molybdenum and silicon.

The projection lens 10 may for example have an anamorphic form. It can have different imaging scales $\beta_x$, $\beta_y$ in the x- and y-directions. The two magnifications $\beta_x$, $\beta_y$ of the projection lens 10 can be $(\beta_x, \beta_y)=(\pm 0.25, \pm/0.125)$. A positive imaging scale $\beta$ means imaging without image inversion. A negative sign for the imaging scale $\beta$ means imaging with image inversion. The projection lens 10 thus leads to a reduction in the ratio 4:1 in the x-direction, i.e. in the direction perpendicular to the scanning direction. The projection lens 10 leads to a reduction of 8:1 in the y-direction, i.e. in the scanning direction. Other imaging scales are likewise possible. Imaging scales with the same sign and the same absolute value in the x-direction and y-direction are also possible, for example with absolute values of 0.125 or of 0.25.

Even though the disclosure has also been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the appended patent claims and the equivalents thereof.

What is claimed is:

1. A control loop configured to control a position of an optical element of a microlithographic projection exposure apparatus, the control loop comprising:
   a controller configured to control a force exerted on the optical element by an actuator of the microlithographic projection exposure apparatus based on a reference signal; and
   a filter arrangement, comprising:
      a first filter configured to: i) suppress an unwanted component in the reference signal; and ii) cause a first signal delay in a first frequency range of the reference signal; and
      a second filter configured to cause a second signal delay in the first frequency range of the reference signal,
   wherein the second signal delay at least partially compensates the first signal delay.

2. The control loop of claim 1, wherein the microlithographic projection exposure apparatus is an EUV microlithographic projection exposure apparatus.

3. The control loop of claim 1, wherein the reference signal is a position signal which is characteristic of a position of a further optical element of the microlithographic projection exposure apparatus.

4. The control loop of claim 3, wherein, relative to an optical beam path of the microlithographic projection exposure apparatus, the further optical element is a last optical element of the microlithographic projection exposure apparatus.

5. The control loop of claim 4, wherein the further optical element is a supporting structure of the microlithographic projection exposure apparatus.

6. The control loop of claim 1, wherein the controller is configured to control a force exerted on a further optical element of the microlithographic projection exposure apparatus by a further actuator of the microlithographic projection exposure apparatus based on the reference signal.

7. The control loop of claim 1, wherein the optical element is a mirror.

8. An apparatus, comprising:
 an optical element;
 an actuator configured to exert a force on the optical element;
 a controller configured to control a position of the optical element by controlling a force exerted on the optical element by the actuator based on a reference signal; and
 a filter arrangement, comprising:
  a first filter configured to: i) suppress an unwanted component in the reference signal; and ii) cause a first signal delay in a first frequency range of the reference signal; and
  a second filter configured to cause a second signal delay in the first frequency range of the reference signal,
 wherein the apparatus is a microlithographic projection exposure apparatus.

9. The apparatus of claim 8, wherein the first signal delay is a positive signal delay generated by the first filter in a settled state, and the second signal delay is a negative signal delay generated by the second filter in the settled state.

10. The apparatus of claim 8, wherein the first filter comprises a low-pass filter.

11. The apparatus of claim 8, wherein the second filter comprises an inverse low-pass filter.

12. The apparatus of claim 11, wherein the inverse low-pass filter is configured to compensate for the signal delay at a frequency of 1 Hz by at least 60%.

13. The apparatus of claim 8, wherein the first filter comprises a notch filter configured to locally suppress an unwanted component in the reference signal.

14. The apparatus of claim 13, wherein the second filter comprises an inverse notch filter.

15. The apparatus of claim 8, wherein the second filter comprises an inverse notch filter.

16. The apparatus of claim 15, wherein the inverse notch filter is configured to compensate for the first signal delay at a frequency of 1 Hz by at least 25%.

17. The apparatus of claim 8, wherein the microlithographic projection exposure apparatus is an EUV microlithographic projection exposure apparatus.

18. The apparatus of claim 8, further comprising a further optical element, wherein the reference signal is a position signal which is characteristic of a position of the further optical.

19. The apparatus of claim 18, wherein, relative to an optical beam path of the microlithographic projection exposure apparatus, the further optical element is a last optical element of the microlithographic projection exposure apparatus.

20. The apparatus of claim 19, wherein the further optical element is a supporting structure of the microlithographic projection exposure apparatus.

21. The apparatus of claim 8, further comprising a further optical element and a further actuator, wherein the controller is configured to control a force exerted on the further optical element by the further actuator based on the reference signal.

22. The apparatus of claim 8, wherein the optical element is a mirror.

* * * * *

UNITED STATES PATENT AND TRADEMARK OFFICE
CERTIFICATE OF CORRECTION

PATENT NO. : 12,468,115 B2  
APPLICATION NO. : 18/333808  
DATED : November 11, 2025  
INVENTOR(S) : Thomas Gorius Page 1 of 2

It is certified that error appears in the above-identified patent and that said Letters Patent is hereby corrected as shown below:

In the Specification

Column 2, Line 1, delete "minors" and insert -- mirrors --.

Column 2, Line 7, delete "minor" and insert -- mirror --.

Column 2, Line 18, delete "minor" and insert -- mirror --.

Column 4, Line 2, delete "minors" and insert -- mirrors --.

Column 5, Line 4, delete "minor." and insert --- mirror. --.

Column 5, Line 51, delete "minor" and insert -- mirror --.

Column 6, Line 3, delete "minors" and insert -- mirrors --.

Column 6, Line 4, delete "minor," and insert -- mirror, --.

Column 9, Line 49, delete "minor" and insert -- mirror --.

Column 9, Line 53, delete "minor." and insert -- mirror. --.

Column 9, Line 57, delete "minor" and insert -- mirror --.

Column 9, Line 58, delete "minor" and insert -- mirror --.

Column 9, Line 60, delete "minor." and insert -- mirror. --.

Signed and Sealed this  
Thirtieth Day of December, 2025

John A. Squires  
*Director of the United States Patent and Trademark Office*

CERTIFICATE OF CORRECTION (continued)
U.S. Pat. No. 12,468,115 B2

Column 9, Line 61, delete "minor" and insert -- mirror --.

Column 9, Line 67, delete "minors" and insert -- mirrors --.

Column 10, Line 3, delete "minor" and insert -- mirror --.

Column 10, Line 13, delete "minors" and insert -- mirrors --.